United States Patent [19]
Kashiwakura et al.

[11] Patent Number: 6,052,326
[45] Date of Patent: Apr. 18, 2000

[54] CHAIN-LATCH CIRCUIT ACHIEVING STABLE OPERATIONS

[75] Inventors: Shoichiro Kashiwakura; Koichi Yamashita, both of Kawasaki, Japan

[73] Assignee: Fujitsu Limited, Kanagawa, Japan

[21] Appl. No.: 09/071,162

[22] Filed: May 4, 1998

[30] Foreign Application Priority Data

Oct. 24, 1997 [JP] Japan .................................. 9-292778

[51] Int. Cl.[7] .................................................. G11C 8/00
[52] U.S. Cl. ............................... 365/230.03; 365/189.05; 365/239
[58] Field of Search ...................... 365/230.03, 189.05, 365/239, 230.08

[56] References Cited

U.S. PATENT DOCUMENTS 4,935,902  6/1990  Tatsuki ..................................... 365/239
5,644,387  7/1997  Oda et al. .......................... 365/198.05
5,857,005  1/1999  Buckenmaier .................. 365/189.05 X

*Primary Examiner*—Huan Hoang
*Attorney, Agent, or Firm*—Nikaido Marmelstein Murray & Oram LLP

[57] ABSTRACT

A semiconductor integrated circuit includes a circuit including a plurality of memory blocks connected in series and operating in synchronism with a clock signal, the circuit holding data in each of the memory blocks during a data-hold state and holding the data between adjacent ones of the memory blocks during a data-transition state. The semiconductor integrated circuit further includes a memory circuit inserted between at least two adjacent ones of the memory blocks and operating in synchronism with the clock signal, the memory circuit holding the data between the at least two adjacent ones of the memory blocks during the data-transition period.

9 Claims, 11 Drawing Sheets

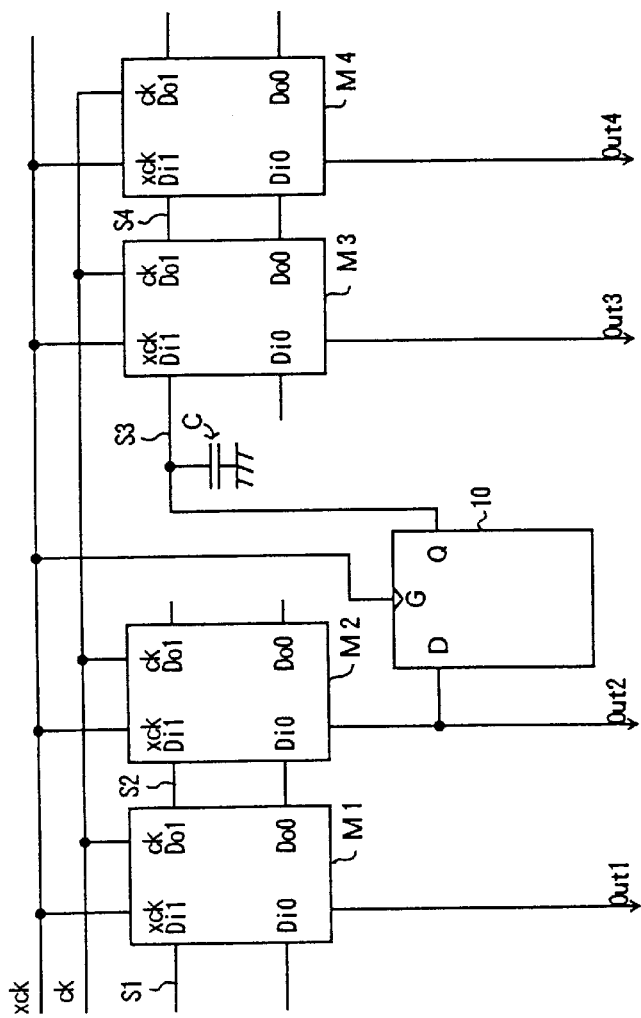
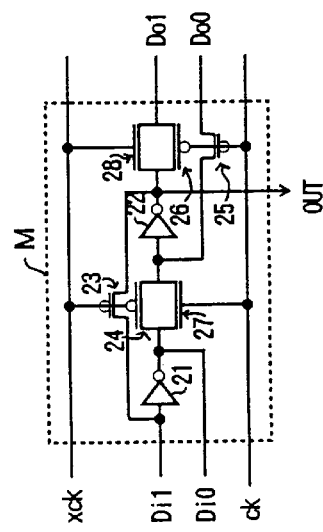
FIG. 3A
FIG. 3B

CHAIN-LATCH CIRCUIT ACHIEVING STABLE OPERATIONS

BACKGROUND OF THE INVENTION

1. Field of the Invention

The present invention generally relates to semiconductor integrated circuits, and particularly relates to a chain-latch circuit having a function equivalent to that of a shift register.

2. Description of the Related Art

When there is a need to supply parallel data to a logic circuit from a data storage after supplying the data serially to the data storage, a shift register is generally used. The shift register is comprised of flip-flops connected in series. Data supplied to the leftmost flip-flop, for example, is transferred to a next flip-flop on the right, and to the next, and so on.

Each flip-flop is comprised eight NAND circuits and two inverters, for example. In this typical circuit configuration, one flip-flop has a circuit size of 10 gates.

In semiconductor integrated circuits, it is generally preferable to implement a given circuit in a chip area as small as possible by employing as small a number of circuit elements as possible. To meet this requirement, a chain latch is suitable since it can be implemented by a small number of circuit elements while achieving an equivalent function to that of a shift register.

FIG. 1 is a circuit diagram of a chain latch.

A chain latch 500 of FIG. 1 includes a plurality of identical memory blocks M connected in series. Each of the memory blocks M receives inputs thereto from the left-hand side of the figure, and supplies outputs therefrom to the right-hand side of the figure. Input data Di0 and Di1 are complementary signals, and so are output data Do0 and Do1.

Each of the memory blocks M includes PMOS transistors 501 through 506 and NMOS transistors 507 through 510. The PMOS transistor 502 and the NMOS transistor 507 together form an inverter. Also, the PMOS transistor 503 and the NMOS transistor 508 together make up an inverter. A pair of the PMOS transistor 504 and the NMOS transistor 509 serves as a gate for controlling whether a signal is transferred therethrough. In the same manner, a pair of the PMOS transistor 505 and the NMOS transistor 510 serves as a gate for controlling whether a signal is transferred therethrough.

With respect to a clock signal CLK, a clock signal XCLK has an opposite phase. When the clock signal CLK is HIGH, therefore, the PMOS transistors 501 and 504 and the NMOS transistors 509 are turned on. In this case, the two inverters together form a latch with each of the inverters receiving as an input thereto an output of the other inverter. This latch holds 1-bit data.

When the clock signal CLK is LOW, the gate comprised of the PMOS transistor 504 and the NMOS transistor 509 is closed, while the gate comprised of the PMOS transistor 505 and the NMOS transistor 510 is opened. Further, the PMOS transistor 506 is turned on. In this case, the inverter on the output side of a given memory block M forms a latch together with an inverter on the input side of a next-stage memory block M, thereby holding 1-bit data.

When the clock signal CLK is changed to HIGH again, the inverter on the input side and the inverter on the output side are connected, and together form a latch within the same memory block M. This latch holds a 1-bit data transferred from the previous-stage memory block M.

In this manner, the chain latch has each memory block M comprised of two inverters, and these two inverters together form a latch to hold data when the clock signal CLK is HIGH (data-hold state). When the clock signal CLK is LOW, the inverter on the output side of a given memory block M forms a latch together with the inverter on the input side of a next-stage memory block M, so that data is held between the two memory blocks M halfway on the transfer route (data-transition state). When the clock signal CLK becomes HIGH again, the two inverters within each memory block M together form a latch, thereby holding data transferred from a preceding-stage memory block M (data-hold state).

As described above, the chain latch implements a function equivalent to that of a shift register by using a relatively small number of circuit elements. Such a chain latch, however, has a problem in that holding of data can become unstable. This is caused by the fact that circuit elements forming latches are altered back and forth between the latches for holding data in the data-hold state and the latches for holding data in the data-transition state during the process of data propagation as the chain latch switches between the data-hold state and the data-transition state.

FIG. 2 is a circuit diagram for explaining the problem of a chain latch. In FIG. 2, the chain latch includes memory blocks M1 through M3. Each of the memory blocks M1 through M3 includes inverters 520 and 521, gates 522 and 523, and PMOS transistors 524 and 525.

Memory blocks of the chain latch are not necessarily arranged in straight line in a semiconductor device. For example, a line of the memory blocks may be folded at a turning point so as to be arranged in two rows in the circuit. I this case, wire lengths between two adjacent memory blocks may be elongated at the turning point, thereby suffering a larger wire capacitance.

In FIG. 2, the memory blocks M2 and M3 are connected via wires (signal lines) N1 and N2, which have wire capacitances (signal-line capacitances) C1 and C2, respectively.

First, a case in which the wire capacitances C1 and C2 are insignificant is considered. As the chain latch switches from the data-hold state to the data-transition state, the gate 523 opens, so that the data held by the memory block M2 appears on the wire N1. The data is input to the inverter 520 of the memory block M3. An output of the inverter 520 is fed back to the input of the inverter 521 of the memory block M2 via the PMOS transistor 525, which is turned on by the clock signal CLK. In the data-transition state, therefore, the inverter 521 of the memory block M2 and the inverter 520 of the memory block M3 together hold data.

When the wire capacitances C1 and C2 are not negligible, it might be possible that the data held by the memory block M2 is destroyed as shown in the following. When the chain latch switches from the data-hold state to the data-transition state, the gate 523 opens, so that the data held by the memory block M2 appears on the wire N1. At the same time as the gate 523 opens, the NMOS transistor 525 is turned on by the clock signal CLK, so that the output of the inverter 520 in the memory block M3 is input to the inverter 521 of the memory block M2. If the capacitances C1 and C2 are negligible as previously described, the data output from the inverter 521 of the memory block M2 changes the status of the inverter 520 of the memory block M3. If the capacitances C1 and C2 are not negligible, it is possible that an output from the inverter 520 of the memory block M3 changes the status of the inverter 521 of the memory block M2, to the contrary to the expectation.

In this manner, when a speed of data propagation is slowed between memory blocks because of an effect of wire capacitances, data on the feedback route can destroy the data held by the memory blocks.

Accordingly, there is a need for a chain-latch circuit which is not susceptible to signal-line capacitances, and can perform expected operations even when a relatively large signal-line capacitance is present.

SUMMARY OF THE INVENTION

Accordingly, it is a general object of the present invention to provide a chain-latch circuit which can satisfy the need described above.

It is another and more specific object of the present invention to provide a chain-latch circuit which is not susceptible to signal-line capacitances, and can perform expected operations even when a relatively large signal-line capacitance is present.

In order to achieve the above objects according to the present invention, a semiconductor integrated circuit includes a circuit including a plurality of memory blocks connected in series and operating in synchronism with a clock signal, the circuit holding data in each of the memory blocks during a data-hold state and holding the data between adjacent ones of the memory blocks during a data-transition state. The semiconductor integrated circuit further includes a memory circuit inserted between at least two adjacent ones of the memory blocks and operating in synchronism with the clock signal, the memory circuit holding the data between the at least two adjacent ones of the memory blocks during the data-transition period.

In the semiconductor integrated circuit described above, the memory circuit is inserted between two adjacent memory blocks to store data during the data-transition state, so that data transfer between the two adjacent memory blocks is properly conducted without destroying data of the former one of the two adjacent memory blocks. Therefore, appropriate data transfer can be achieved even when non-negligible signal-line capacitances are present because of layout restrictions or the like.

According to one aspect of the present invention, the semiconductor integrated circuit described above is structured such that the memory circuit is implemented by using a flip-flop. Therefore, a simple circuit configuration can achieve a chain-latch circuit which is capable of performing appropriate operations without suffering from an effect of signal-line capacitances.

According to another aspect of the present invention, a semiconductor integrated circuit is structured such that a clock signal for controlling a signal connection of a feedback route is delayed behind a clock signal for controlling a signal connection of a data-transfer route. In this configuration, data of a given memory block can be renewed before data of a preceding memory block is destroyed by a signal returning via the feedback route. Therefore, appropriate data transfer can be achieved even when non-negligible signal-line capacitances are present because of layout restrictions or the like.

According to another aspect of the present invention, the semiconductor integrated circuit described above is structured such that delay circuits adjust timings of the clock signals.

According to another aspect of the present invention, a semiconductor integrated circuit is structured such that a data-hold circuit serves as a support to hold data of a memory block so as to step up the data-hold capacity of the memory block, thereby preventing a signal returning via a feedback route from destroying the data of the memory block. Therefore, appropriate data transfer can be achieved even when non-negligible signal-line capacitances are present because of layout restrictions or the like.

According to another aspect of the present invention, the semiconductor integrated circuit described above is structured such that a connection-control circuit controls signal connections between the memory block and the data-hold circuit so as to effect the supporting data-hold capacity at appropriate timings.

According to another aspect of the present invention, the semiconductor integrated circuit described above is structured such that the connection-control circuit operates in synchronism with either a first clock signal or a second clock signal having a timing ahead of that of the first clock signal, thereby effecting the supporting data-hold capacity at appropriate timings. When the second clock signal is used, stable operations can be achieved by insuring that the supporting data-hold function comes into effect to fix the data before the signal returning via the feedback route tries to rewrite the data.

According to another aspect of the present invention, the semiconductor integrated circuit described above is structured such that the connection-control circuit is implemented by using transmission gates. Therefore, a simple circuit structure can achieve appropriate data-transfer operations.

According to another aspect of the present invention, the semiconductor integrated circuit described above is structured such that the data-hold circuit is implemented by using a latch circuit. Therefore, a simple circuit structure can achieve appropriate data-transfer operations. Further, the data-hold circuit may be comprised of a latch-amplifier circuit. This configuration ensures stable high-speed data-transfer operations by drawing on a data-amplification function and a high-speed operability of the latch-amplifier circuit.

According to another aspect of the present invention, a semiconductor integrated circuit is structured such that a memory circuit is inserted between two chain-latch circuits in order to transfer data from one to the other of the two chain-latch circuit. Therefore, appropriate data transfer can be achieved even when non-negligible signal-line capacitances are present between the two chain-latch circuits because of layout restrictions or the like.

Other objects and further features of the present invention will be apparent from the following detailed description when read in conjunction with the accompanying drawings.

BRIEF DESCRIPTION OF THE DRAWINGS

FIG. 3A is a circuit diagram of a chain-latch circuit according to a first embodiment of the present invention;

FIG. 3B is a circuit diagram of one memory block shown as a representative of a plurality of identical memory blocks of the chain-latch circuit of FIG. 3A;

DESCRIPTION OF THE PREFERRED EMBODIMENTS

In the following, embodiments of the present invention will be described with reference to the accompanying drawings.

FIG. 3A is a circuit diagram of a chain-latch circuit according to a first embodiment of the present invention. FIG. 3B is a circuit diagram of one memory block shown as a representative of a plurality of identical memory blocks of the chain-latch circuit of FIG. 3A.

The chain-latch circuit of FIG. 3A includes memory blocks M1 through M4 and a flip-flop 10. Each of the memory blocks M1 through M4 has the same configuration as that used in a conventional chain-latch circuit, and a circuit configuration thereof is shown in FIG. 3B. As shown in FIG. 3B, the memory block M, which represents any one of the memory blocks M1 through M4, includes inverters 21 and 22, PMOS transistors 23 through 26, and NMOS transistors 27 and 28. Operations of the memory block M are the same as in the related art, and a description thereof will be omitted.

A flip-flop 10 is provided between the memory block M2 and the memory block M3 in order to transfer data from the memory block M2 to the memory block M3. It is assumed that signal lines have a capacitance which cannot be ignored irrespective of a layout of these signal lines between the memory block M2 and the memory block M3. This may be caused by excessively long signal lines which are required to connect between the memory block M2 and the memory block M3 because of layout constraints or the like. Such a capacitance is shown as a signal-line capacitance C in connection with a signal line which connects the flip-flop 10 with the memory block M3.

If the memory block M2 is directly connected with the memory block M3, signal propagation from the memory block M2 to the memory block M3 is delayed by the capacitance larger than a negligible capacitance, so that the data of the memory block M2 will be destroyed by an unintended function of the feedback path. That is, a signal transmission cannot be properly conducted between the memory block M2 and the memory block M3. In consideration of this, the present invention inserts the flip-flop 10 between memory blocks when a larger-than-negligible capacitance or the like prevents an intended signal transmission between these memory blocks, thereby achieving an appropriate signal transmission.

Figure 1:
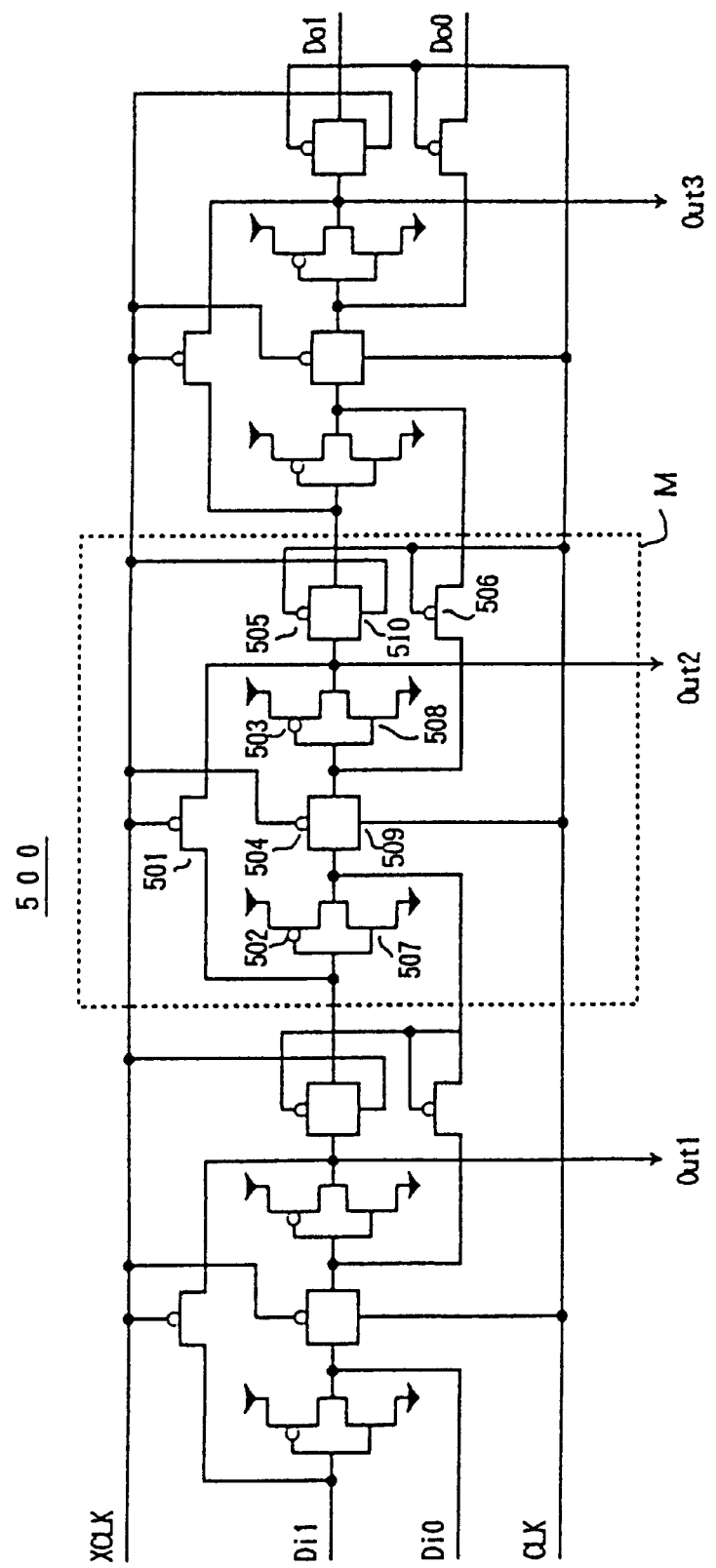
FIG. 1 is a circuit diagram of a chain latch.
Figure 2:
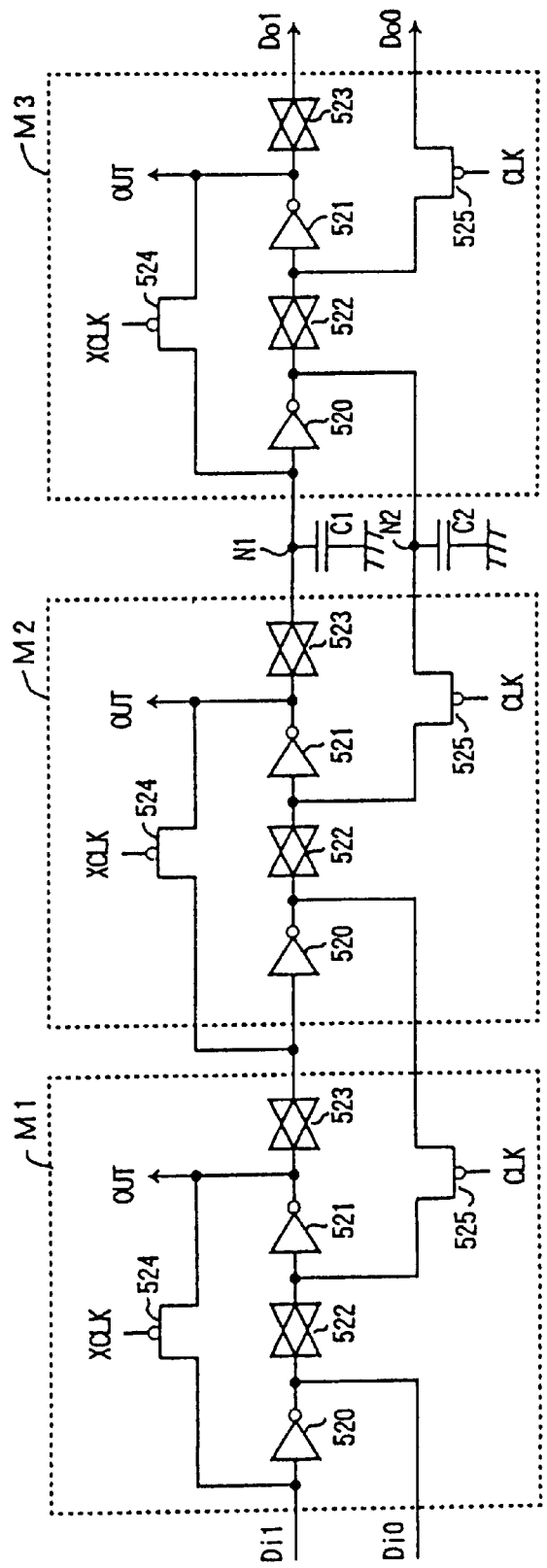
FIG. 2 is a circuit diagram for explaining the problem of a chain latch.
Figure 4:
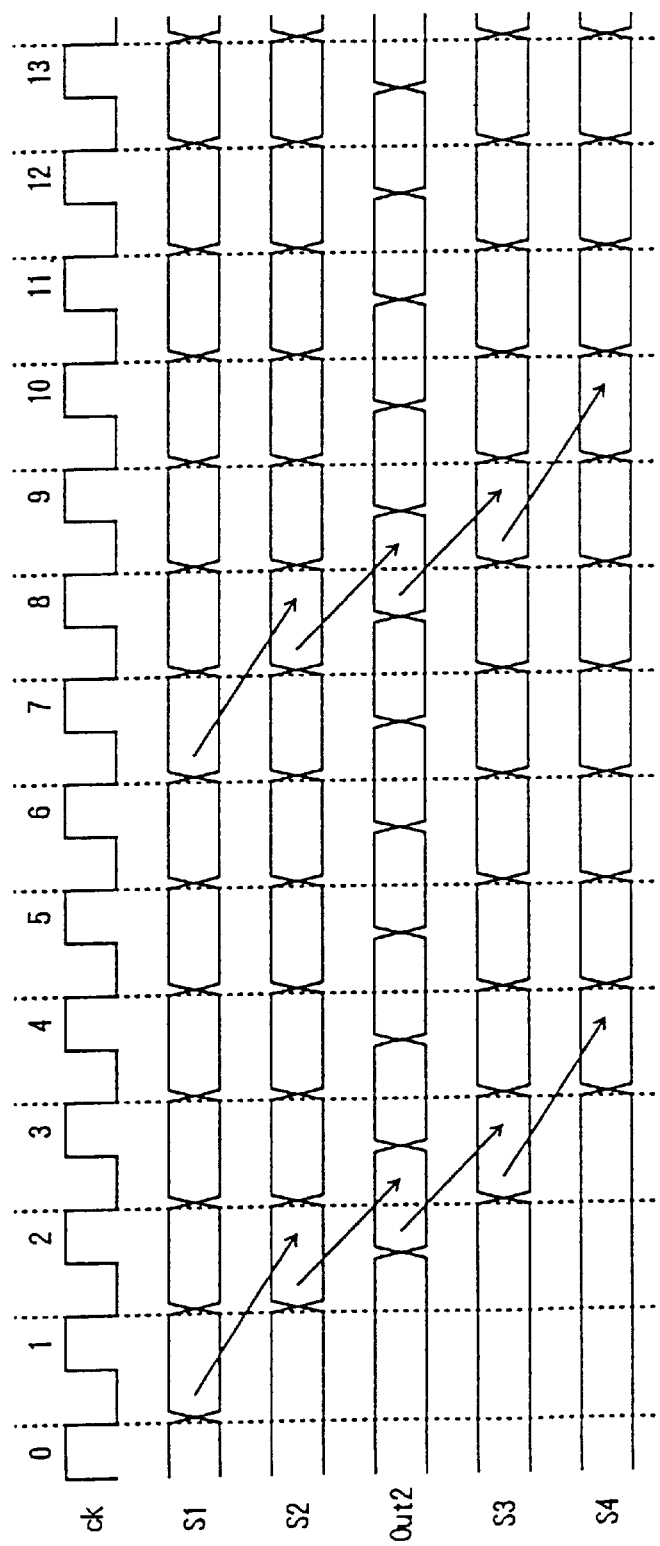
FIG. 4 is a timing chart for explaining operations of the chain-latch circuit of FIG. 3A.

FIG. 4 is a timing chart for explaining operations of the chain-latch circuit of FIG. 3A. FIG. 4 shows signals S1 through S4 input to a Di1 node of the memory blocks M1 through M4, respectively, and also shows an output Out2 of the memory block M2.

As shown in FIG. 4, outputs of the memory block M1 through M4 are changed at falling edges of a clock signal ck. When the signal S1 is input to the memory block M1, the signal S2 is changed at a falling edge of a first clock pulse of the clock signal ck. Here, the signal S2 is a Do1 output of the memory block M1, and is also a Di1 input to the memory block M2. During a HIGH level of the second clock pulse, the NMOS transistor 27 (and the PMOS transistors 23 and 24) shown in FIG. 3B is turned on, so that the output signal Out2 is sent out from the memory block M2.

The flip-flop 10 of FIG. 3A latches a signal input to a D input at a rising edge of an inverted clock signal xck (i.e., at the falling edge of a clock signal ck). Namely, the flip-flop 10 latches the output signal Out2 from the memory block M2 at a falling edge of the second pulse of the clock signal ck in FIG. 4, so that the signal S3 output from the flip-flop 10 is changed at this timing. Then, the signal S4 is changed at a falling edge of the third clock pulse of the clock signal ck. The signal S4 is a Do1 output of the memory block M3, and is also a Di1 input to the memory block M4.

In this manner, the chain-latch circuit according to the first embodiment of the present invention inserts a flip-flop for a data-transfer purpose between memory blocks when an influence of a capacitance or the like prevents appropriate data transfer between these memory blocks. Use of this flip-flop prevents destruction of data in the preceding memory block, and achieves appropriate data transfer. In this case, the capacitance C of FIG. 3A affects the signal S2 by serving as a delay element, but does not affect a nature of the data transfer. The first embodiment employs a flip-flop for the above-mentioned purposes. It is apparent, however, that any appropriate type of a sequential circuit operating in synchronism with a clock signal may be used in place of the flip-flop in order to achieve a data-storage function equivalent to that of the flip-flop.

Figure 5:
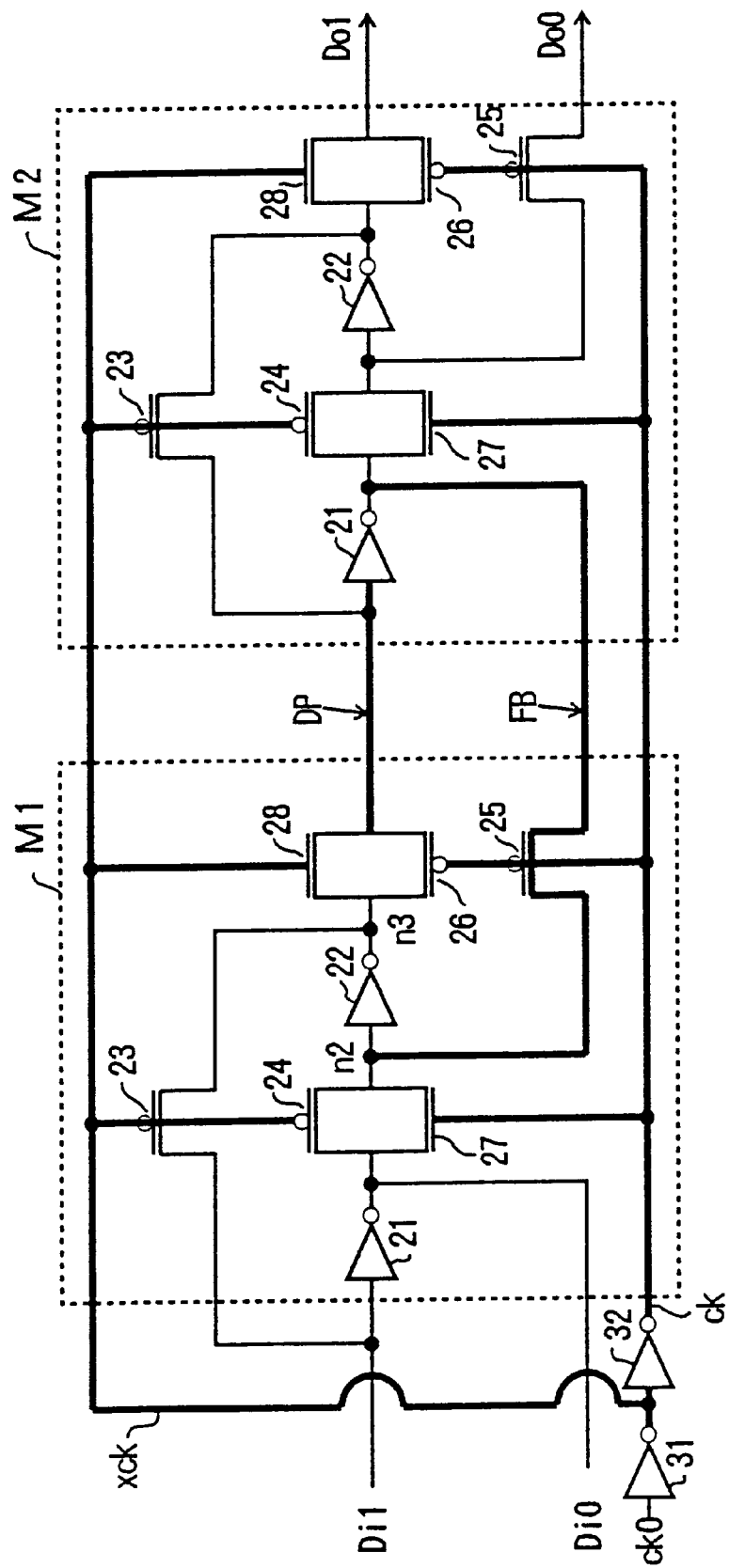
FIG. 5 is a circuit diagram of a chain-latch circuit according to a second embodiment of the present invention.

FIG. 5 is a circuit diagram of a chain-latch circuit according to a second embodiment of the present invention. In FIG. 5, the same elements as those of FIG. 3B are referred to by the same numerals, and a description thereof will be omitted.

The chain-latch circuit of FIG. 5 includes memory blocks M1 and M2 having the same configuration as the memory block M of FIG. 3B, and further includes inverters 31 and 32. Connections between the memory blocks M1 and M2 have capacitances which are larger than a negligible level.

The inverter 31 inverts a clock signal ck0 to output a clock signal xck, and the inverter 32 further inverts the clock signal xck to output a clock signal ck. The inverter 32 introduces an appropriate delay such that the clock signal ck ends up having a signal-change timing slightly delayed behind that of the clock signal xck.

The chain-latch circuit of the second embodiment differs from a related-art chain-latch circuit in that the clock signal ck is delayed behind the clock signal xck by an appropriate delay time.

Figure 6:
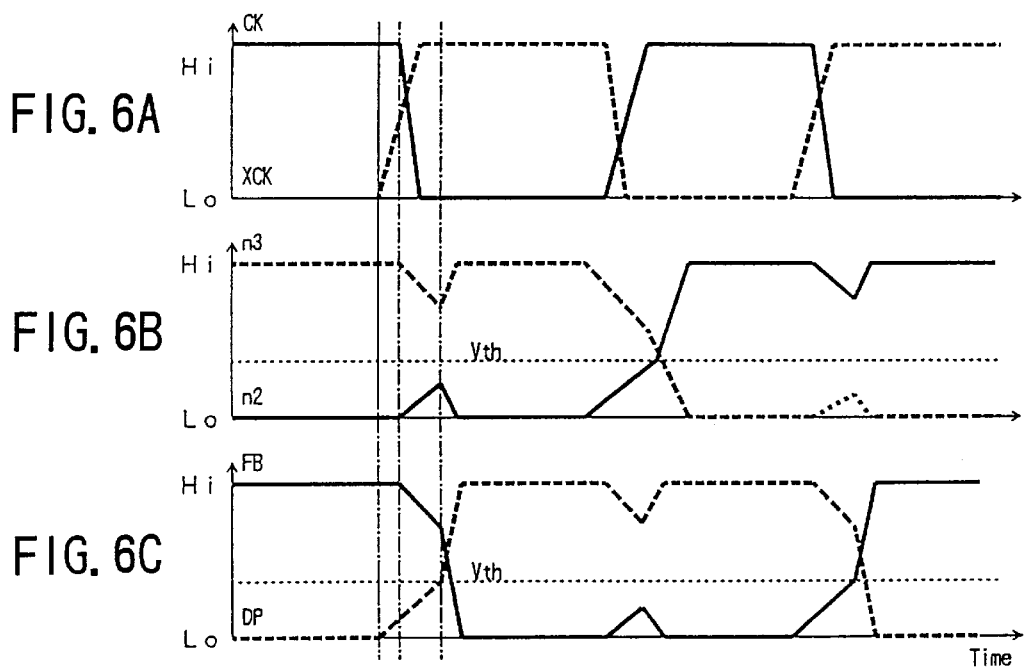
FIGS. 6A through 6C are timing charts showing operations of the chain-latch circuit of FIG. 5.

FIGS. 6A through 6C are timing charts showing operations of the chain-latch circuit of FIG. 5. FIG. 6A shows the clock signal ck and the clock signal xck, and FIG. 6B illustrates signals observed at nodes n2 and n3 of FIG. 5. FIG. 6C exhibits signal changes observed at a data-propagation signal line DP and a feedback signal line FB.

With reference to FIG. 5 and FIGS. 6A through 6C, operations of the chain-latch circuit of FIG. 5 will be described.

As shown in FIG. 6A, the clock signal xck starts rising ahead of a fall in the clock signal ck. When this happens, the NMOS transistor 28 of the memory block M1 in FIG. 5 starts to be turned on, and data of the memory block M1 begins to appear on the data-propagation signal line DP as shown in FIG. 6C. At this moment, the feedback signal line FB carries output data of the inverter 21 of the memory block M2 shown in FIG. 5.

After this, the clock signal ck starts to fall, so that the PMOS transistor 25 of the memory block M1 starts to be turned on. Along with this, a voltage level of the feedback signal line FB starts to appear at the node n2 as shown in FIG. 6B. Concurrently, a voltage level at the node n3, which is an output of the inverter 22 receiving the voltage level of the node n2 as an input thereto, starts to change. That is, the data held by the memory block M1 starts to be changed by the voltage level of the feedback signal line FB.

A timing of data emergence on the data-propagation signal line DP is ahead of a timing at which the signal on the feedback signal line FB starts affecting the data of the memory block M1. Because of this, the voltage level of the data-propagation signal line DP shown in FIG. 6C changes to reach a threshold voltage Vth of the inverter 21 before the voltage level of the node n2 shown in FIG. 6B is changed by the feedback signal line FB to reach a threshold voltage Vth of the inverter 22.

When the voltage level on the data-propagation signal line DP reaches the threshold voltage Vth of the inverter 21 in the memory block M2, an output of the inverter 21 is inverted, so that the voltage level of the feedback signal line FB is changed to LOW. After this, the latch comprised of the inverters 21 and 22 holds a condition in which signals on the data-propagation signal line DP and the feedback signal line FB are HIGH and LOW, respectively.

If there is no timing difference in signal-level changes between the clock signals ck and xck, the status of the inverter 22 in the memory block M1 is inverted by the signal of the feedback signal line FB before this signal is changed to a renewed level, thereby destroying the data of the memory block M1. This takes place when a data-propagation speed is lower than a data-feedback speed because of significant signal-line capacitances residing between the memory block M1 and the memory block M2.

In the second embodiment of the present invention described above, the clock signal ck is delayed by an appropriate delay time behind the clock signal xck in order to delay a signal returning to a preceding memory block via a feedback path. This achieves appropriate data transfer between memory blocks even when greater-than-negligible signal-line capacitances are present between the memory blocks.

Figure 7:
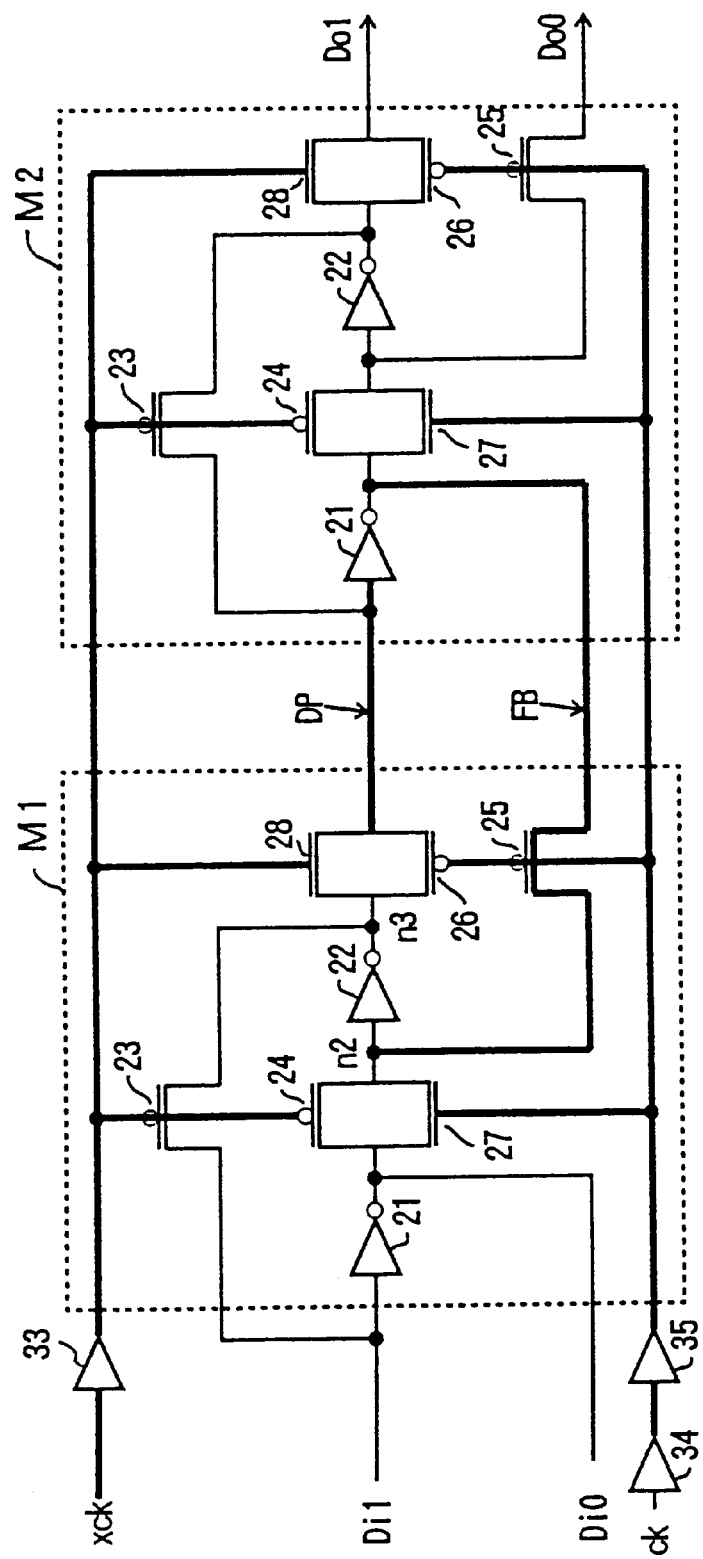
FIG. 7 is a circuit diagram showing a variation of the second embodiment of the present invention.

FIG. 7 is a circuit diagram showing a variation of the second embodiment of the present invention. In FIG. 7, the same elements as those of FIG. 5 are referred to by the same numerals, and a description thereof will be omitted.

In the chain-latch circuit of FIG. 7, delay buffers 33 through 35 are provided in place of the inverters 31 and 32 of FIG. 5. The delay buffer 33 delays the clock signal xck, and the delay buffers 34 and 35 delay the clock signal ck. This makes it possible to delay the clock signal ck further behind the clock signal xck and to supply same to the memory block M1. It is apparent that this configuration can achieve the same operations as those of FIG. 5.

As is typified in the variation of the second embodiment of the present invention, timing adjustment of the clock signals ck and xck can be achieved by variety of different configurations, and selecting one of such configurations is a matter of design choice.

Figure 8:
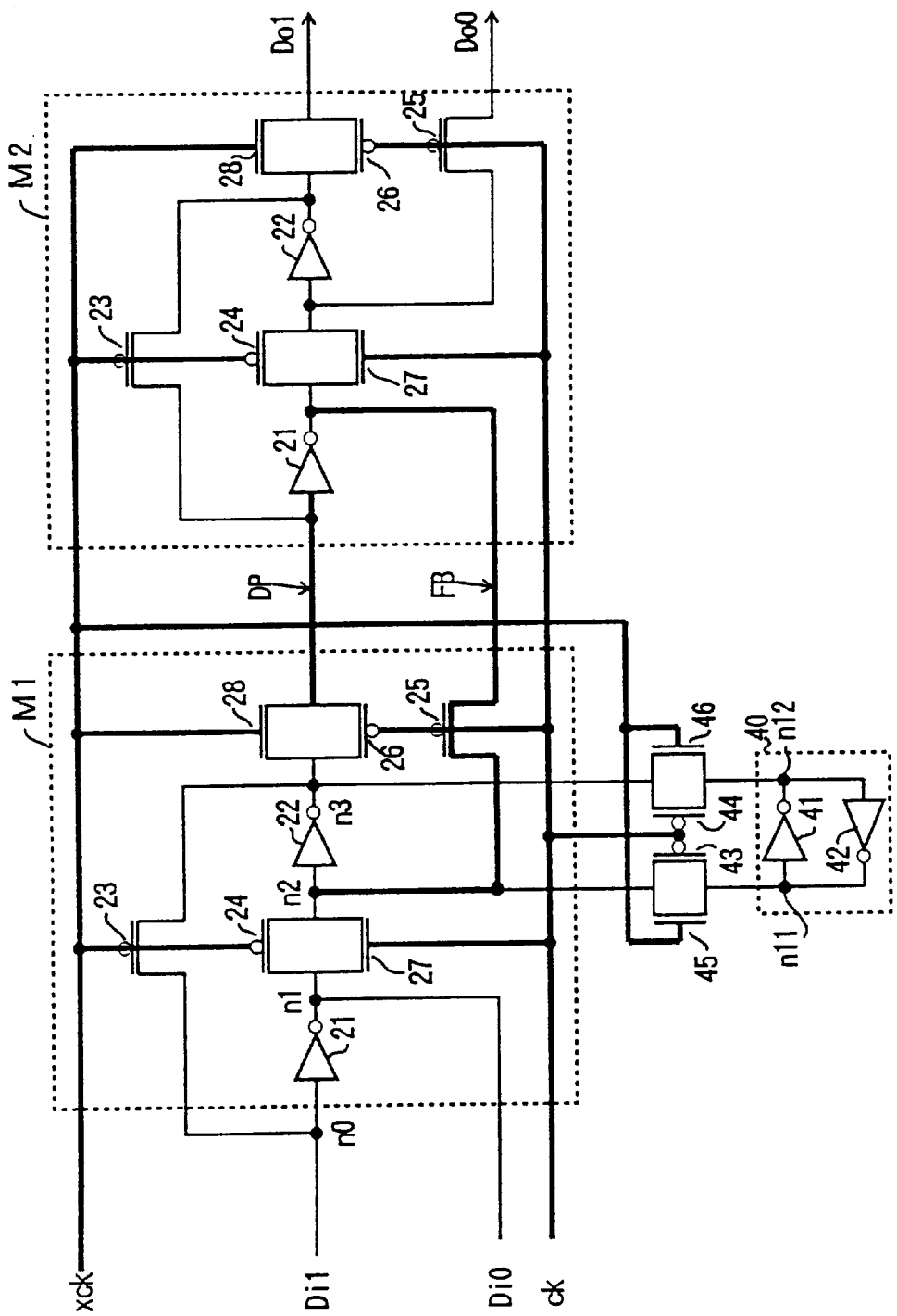
FIG. 8 is a circuit diagram of a chain-latch circuit according to a third embodiment of the present invention.

FIG. 8 is a circuit diagram of a chain-latch circuit according to a third embodiment of the present invention. In FIG. 8, the same elements as those of FIG. 3B are referred to by the same numerals, and a description thereof will be omitted.

In the chain-latch circuit of FIG. 8, the memory blocks M1 and M2 are connected with each other, and a latch 40 is connected to the memory block M1 via transmission gates. It is assumed that signal lines between the memory blocks M1 and M2 have signal-line capacitances greater than a negligible level.

The latch 40 is provided with an aim of protecting the data of the memory block M1 from being destroyed by the signal appearing on the feedback signal line FB. The latch 40 includes inverters 41 and 42. The latch 40 is connected via the transmission gates to an input and an output of the inverter 22 in the memory block M1, and the transmission gates include PMOS transistors 43 and 44 and NMOS transistors 45 and 46. The PMOS transistors 43 and 44 receive a clock signal ck at a gate thereof, and the NMOS transistors 45 and 46 receive a clock signal xck at a gate thereof. When the clock signal ck is LOW (i.e., when xck is HIGH), the transmission gates will open.

As previously described, when connections between the memory blocks M1 and M2 have signal-line capacitances exceeding a negligible level, the signal on the feedback signal line FB may destroy the data of the memory block M1 in a conventional configuration. This is because the signal on the feedback signal line FB reaches the node n2 when the PMOS transistor 25 of the memory block M1 is turned on during the LOW-level period of the clock signal ck.

In the third embodiment of the present invention, the latch 40 is coupled to the input and the output of the inverter 22 in the memory block M1 when the clock signal ck is LOW, thereby preventing data destruction in the memory block M1.

Figure 9:
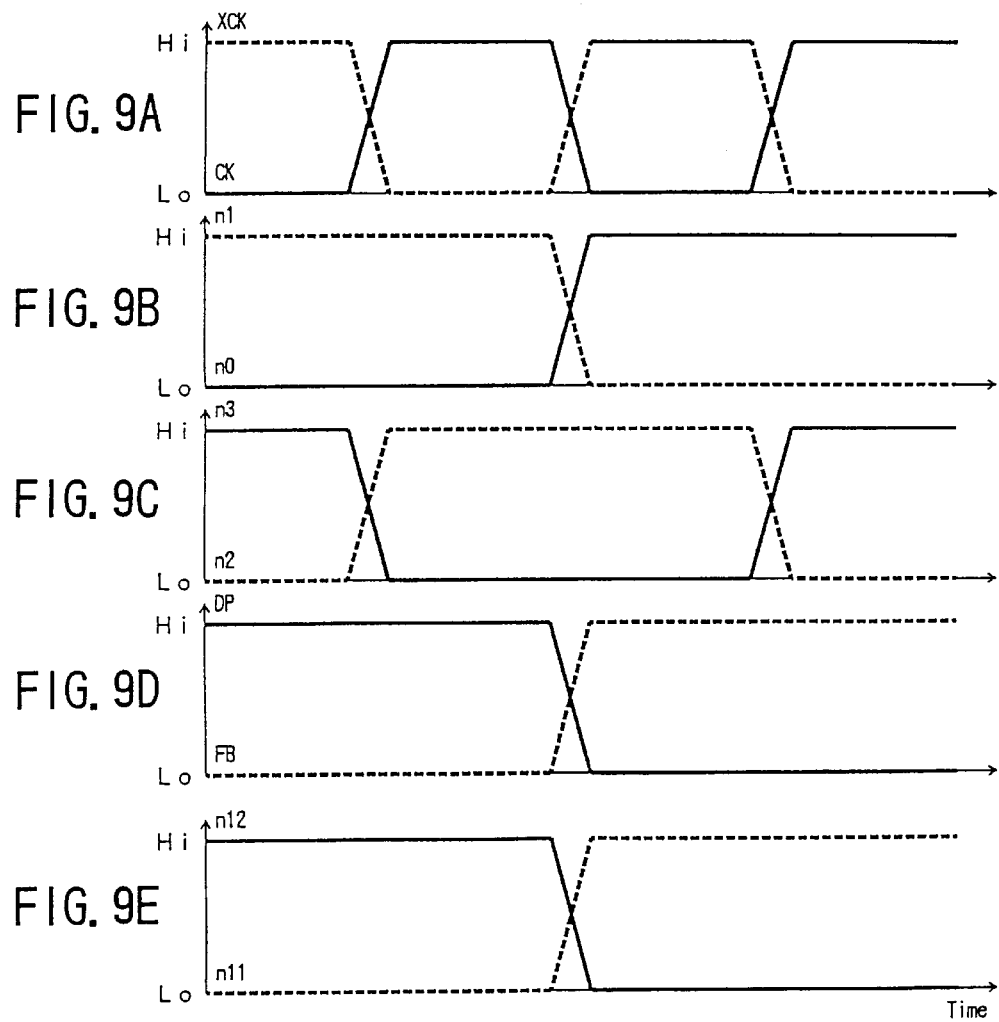
FIGS. 9A through 9E are timing charts for explaining operations of the chain-latch circuit of FIG. 8.

FIGS. 9A through 9E are timing charts for explaining operations of the chain-latch circuit of FIG. 8. As shown in FIGS. 9A through 9C, when the clock signals ck and xck are changed to HIGH and LOW, respectively, data (LOW) which is input to the node n0 of the memory block M1 is held by the latch comprised of the inverters 21 and 22, so that the nodes n2 and n3 become HIGH and LOW, respectively. This condition represents the data stored in the memory block M1.

When the clock signals ck and xck then become LOW and HIGH, respectively, the transmission gates comprised of the PMOS transistors 43 and 44 and the NMOS transistors 45 and 46 shown in FIG. 8 are opened. This results in the nodes 11 and 12 being HIGH and LOW, respectively, as shown in FIG. 9E. In this manner, the latch 40 holds the data of the memory block M1.

When this happens, the signal on the feedback signal line FB tries to replace the data of the memory block M1. Since the latch 40 helps to step up the data holding capacity of the memory block M1, the data of the memory block M1 supported by the latch 40 is not replaced. As a result, when the data of the memory block M1 appears on the data-propagation signal line DP as shown in FIG. 9D, the signal level of the feedback signal line FB is changed to an invert of the signal level of the data-propagation signal line DP.

In the third embodiment described above, the latch is provided for the memory block in order to serve as a support to hold the data when the memory block is immune to data destruction otherwise. The latch serving as the support helps to step up the data holding capacity of the memory block, thereby preventing undesirable data destruction.

Figure 10:
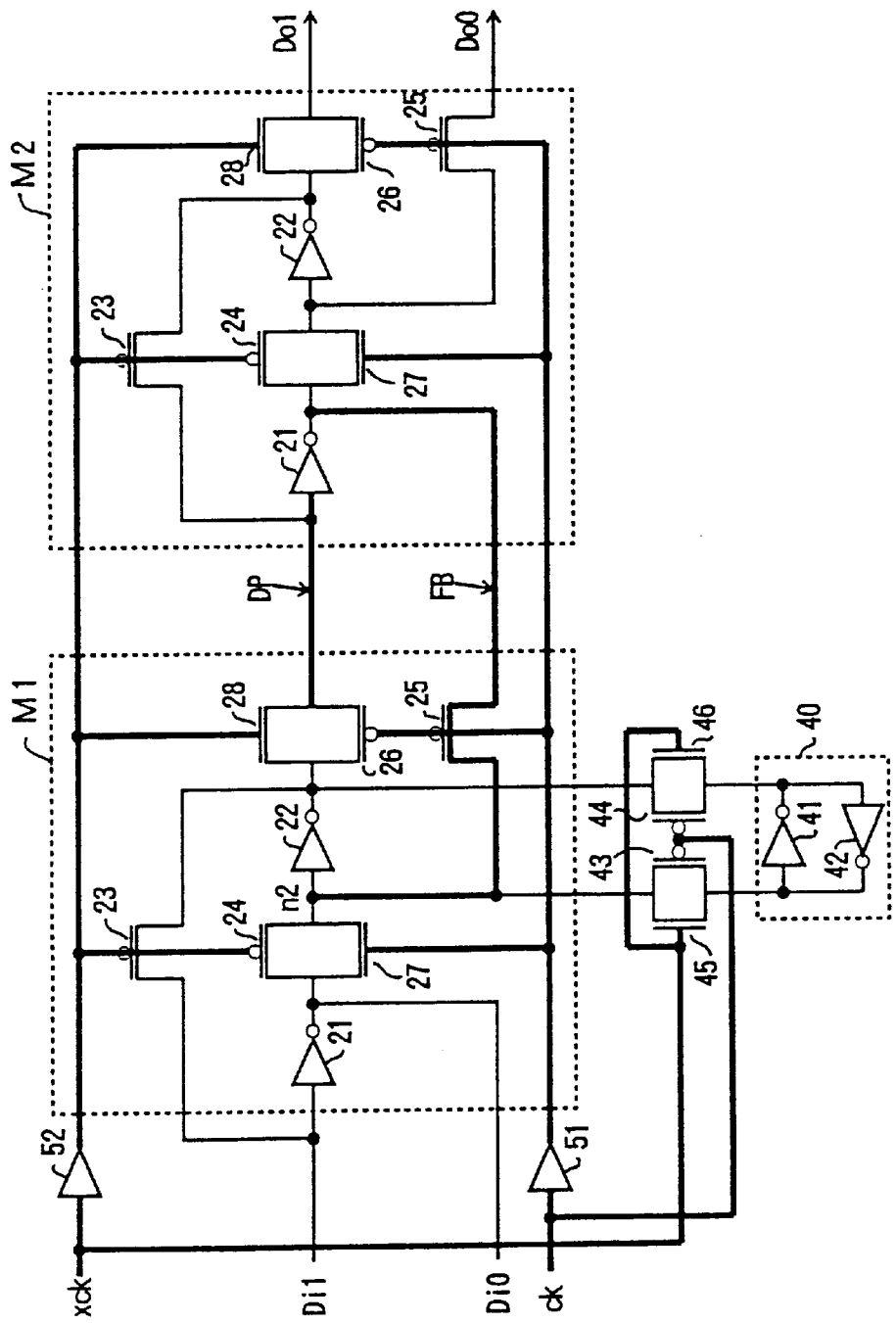
FIG. 10 is a circuit diagram of a first variation of the chain-latch circuit according to the third embodiment of the present invention.

FIG. 10 is a circuit diagram of a first variation of the chain-latch circuit according to the third embodiment of the present invention. In FIG. 10, the same elements as those of FIG. 8 are referred to by the same numerals, and a description thereof will be omitted.

In FIG. 10, the clock signals ck and xck are delayed by delay buffers 51 and 52, respectively, before being supplied to the memory block M1. The transmission gates which couple the latch 40 with the memory block M1 are controlled to open or close by the clock signals ck and xck which are not delayed. Here, the latch 40 serves as a support to step up the data holding capacity of the memory block M1.

In the configuration of FIG. 10, therefore, the transmission gates comprised of the PMOS transistors 43 and 44 and the NMOS transistors 45 and 46 are opened before the PMOS transistor 25 of the memory block M1 is turned on to allow the signal on the feedback signal line FB to appear at the node n2. Namely, the latch 40 serves as a support to hold the data of the memory block M1 before the signal on the feedback signal line FB tries to replace the data of the memory block M1.

In the first variation of the third embodiment of the present invention described above, the chain-latch circuit shifts into a data-transition state for data propagation after the data stored in the memory block during the data-hold state is securely latched by the supporting data-hold mechanism, thereby achieving stable operations.

Figure 11:
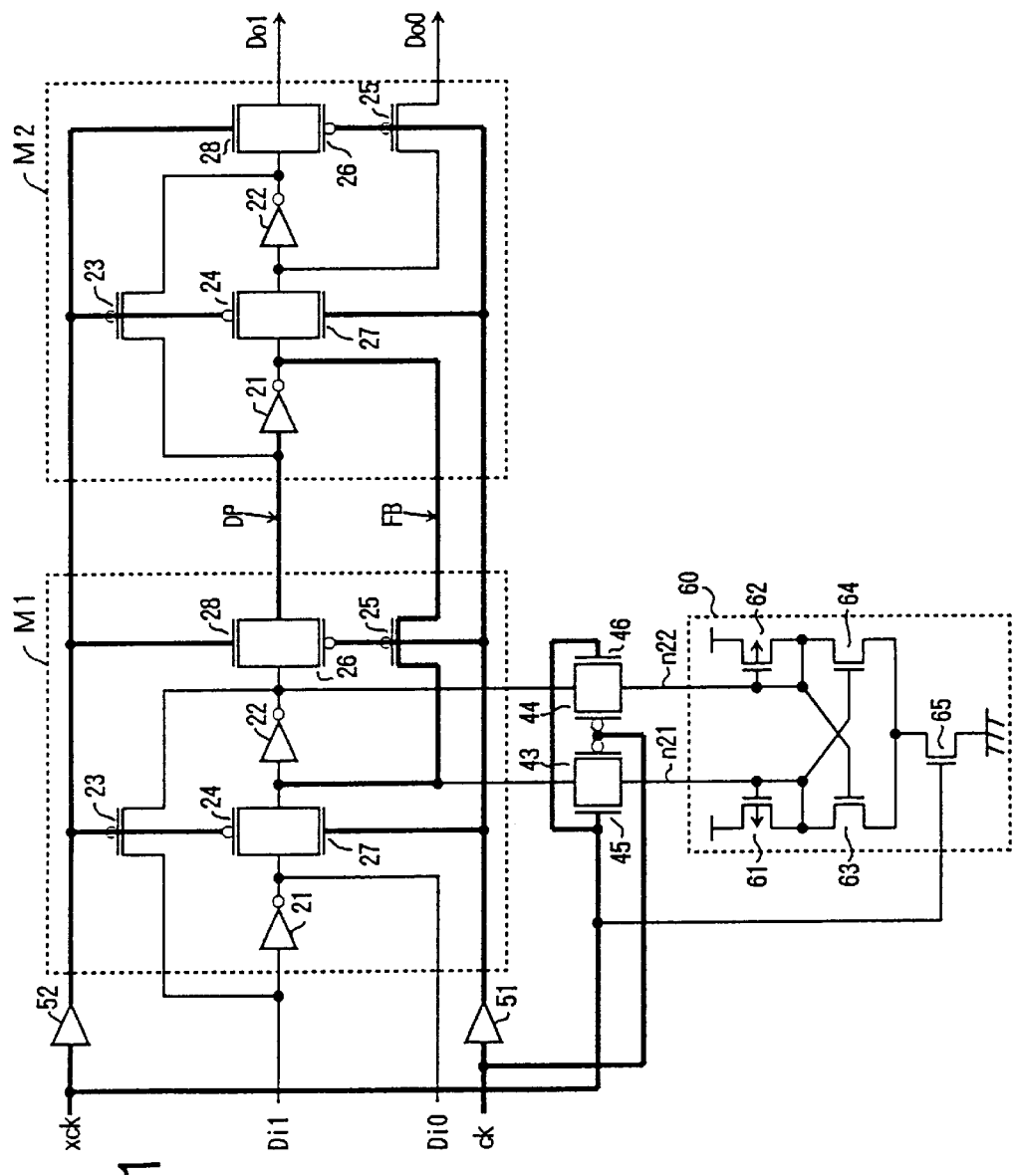
FIG. 11 is a circuit diagram of a second variation of the chain-latch circuit according to the third embodiment of the present invention.

FIG. 11 is a circuit diagram of a second variation of the chain-latch circuit according to the third embodiment of the present invention. In FIG. 11, the same elements as those of FIG. 10 are referred to by the same numerals, and a description thereof will be omitted.

A chain-latch circuit of FIG. 11 is provided with a latch amplifier 60 in place of the latch 40 of FIG. 10. The latch amplifier 60 includes PMOS transistors 61 and 62 and NMOS transistors 63 through 65. The NMOS transistor 65 receives the clock signal xck at a gate thereof. The latch amplifier 60 operates in synchronism with the clock signal xck.

When the clock signal xck is changed to HIGH to open the transmission gates comprised of the PMOS transistors 43 and 44 and the NMOS transistors 45 and 46, the data stored in the memory block M1 appears as a voltage difference between a node 21 and a node 22. The latch amplifier 60 starts operating when the clock signal xck becomes HIGH, and amplifies the slight voltage difference between the nodes 21 and 22 to hold the data.

The latch amplifier 60 is capable of detecting a slight voltage difference and operating at high speed. Because of this, the latch amplifier 60 of the second variation shown in FIG. 11 is able to latch and fix the data of the memory block M1 faster than the latch 40 of the first variation shown in FIG. 10. This makes it possible to provide a greater timing margin against the data-destruction effect of the feedback signal line FB, thereby achieving stable high-speed operations.

Further, the present invention is not limited to these embodiments, but various variations and modifications may be made without departing from the scope of the present invention.

What is claimed is:

1. A semiconductor integrated circuit comprising:

a chain latch circuit including a plurality of chain latch memory blocks connected in series and operating in synchronism with a clock signal, said chain latch circuit holding data in each of said chain latch memory blocks during a data-hold state and holding said data between adjacent ones of said chain latch memory blocks during a data-transition state; and a memory circuit inserted between at least two adjacent ones of said chain latch memory blocks and operating in synchronism with said clock signal, said memory circuit holding said data between said at least two adjacent ones of said chain latch memory blocks during said data-transition period.

2. The semiconductor integrated circuit as claimed in claim 1, wherein said memory circuit comprises a flip flop.

3. A semiconductor integrated circuit comprising:

a chain latch circuit including a plurality of chain latch memory blocks connected in series and operating in synchronism with a clock signal, said chain latch circuit holding data in each of said chain latch memory blocks during a data-hold state and holding said data between adjacent ones of said chain latch memory blocks during a data-transition state; and a data-hold circuit attached to at least one of said chain latch memory blocks and serving as an external support to hold data which is held by said at least one of said chain latch memory blocks during said data-hold state.

4. The semiconductor integrated circuit as claimed in claim 3, further comprising a connection-control circuit which controls a signal connection between said data-hold circuit and said at least one of said chain latch memory blocks.

5. The semiconductor integrated circuit as claimed in claim 4, wherein said connection-control circuit controls said signal connection in synchronism with said clock signal.

6. The semiconductor integrated circuit as claimed in claim 4, wherein said connection-control circuit controls said signal connection in synchronism with another clock signal having a timing ahead of a timing of said clock signal.

7. The semiconductor integrated circuit as claimed in claim 4, wherein said connection-control circuit comprises transmission gates.

8. The semiconductor integrated circuit as claimed in claim 3, wherein said data-hold circuit comprises a latch circuit.

9. The semiconductor integrated circuit as claimed in claim 3, wherein said data-hold circuit comprises a latch-amplifier circuit.

* * * * *